(12) United States Patent
Vinciguerra et al.

(10) Patent No.: US 8,586,451 B2
(45) Date of Patent: Nov. 19, 2013

(54) FLEXIBLE ELECTRONIC DEVICE AND METHOD FOR THE FABRICATION OF SAME

(75) Inventors: Vincenzo Vinciguerra, Biancavilla (IT); LuigiGiuseppe Occhipinti, Ragusa (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

(21) Appl. No.: 13/533,224

(22) Filed: Jun. 26, 2012

(65) Prior Publication Data

US 2012/0329213 A1    Dec. 27, 2012

(30) Foreign Application Priority Data

Jun. 27, 2011  (IT) ................. VI2011A0169

(51) Int. Cl.
    *H01L 21/46*        (2006.01)
(52) U.S. Cl.
    USPC .................. 438/459; 257/E21.568
(58) Field of Classification Search
    USPC .................. 438/459; 257/E21.568
    See application file for complete search history.

(56) References Cited

U.S. PATENT DOCUMENTS

| 5,374,564 | A  |   | 12/1994 | Bruel |
| 5,733,814 | A  | * | 3/1998  | Flesher et al. ................ 438/460 |
| 5,882,987 | A  |   | 3/1999  | Srikrishnan |
| 6,743,654 | B2 |   | 6/2004  | Coffa et al. |
| 7,864,115 | B2 | * | 1/2011  | Yamazaki et al. ..... 343/700 MS |
| 8,062,976 | B2 |   | 11/2011 | Vecchione et al. |
| 2007/0183184 | A1 | * | 8/2007 | Nakamura et al. ........... 365/149 |
| 2008/0009095 | A1 |   | 1/2008 | Charles, Jr. et al. |

FOREIGN PATENT DOCUMENTS

| EP | 1215476 A2      | 6/2002 |
| IT | 2009VA000054 A1 | 1/2011 |

* cited by examiner

*Primary Examiner* — William D Coleman
(74) *Attorney, Agent, or Firm* — Allen, Dyer, Doppelt, Milbrath & Gilchrist, P.A.

(57) ABSTRACT

A semiconductor device may have a thickness, such that the semiconductor devices are not flexible, and may be bonded and electrically coupled on a flexible substrate. After this bonding, the semiconductor device may be thinned so as to be rendered flexible.

26 Claims, 12 Drawing Sheets

FLEXIBLE ELECTRONIC DEVICE AND METHOD FOR THE FABRICATION OF SAME

FIELD OF THE INVENTION

The present disclosure relates to the field of flexible electronics, and in particular, to flexible electronic devices and related methods.

BACKGROUND OF THE INVENTION

Flexible electronics is becoming more and more important in the last years. In particular, flexible electronics can be important because it allows the integration of high performance electronic devices to several fields of application where typical electronics on rigid substrates could not be integrated. Flexible electronic devices can be easily integrated on several kinds of curved surfaces. For example, within the healthcare sector, electronic devices and circuits developed on flexible substrates can be exploited to monitor, for example, glucose blood level, temperature, pressure, etc. In such a way, electronic plasters, implantable sensors, etc., can be developed. The method and devices developed with the same may enable such sensors developed on a flexible substrate to be minimally invasive and more easily accepted by the patient since they are better adapted to the shape of the human body than typical electronic devices and systems. Other application fields include ambient intelligence, distributed sensors, electronics on textiles, energy harvesting, power management, and industrial electronics.

One potential issue relating to flexible electronics concerns the fabrication of flexible electronic devices. In particular, the fabrication of flexible electronic devices may be critical because it involves the handling of flexible, and thus fragile, semiconductor devices. Accordingly, the fabrication of flexible electronic devices is costly since it involves the employment of special handling and packaging tools suitable for handling flexible semiconductor devices without damaging them.

According to typical methods for the fabrication of flexible electronic devices, the silicon wafer is typically thinned down to less than 100 micrometers before preparing the single die. In particular, after thinning of the wafer, the die are prepared, for example, by way of solder bumping of the chip pads, and cut using several kinds of typical dicing methods, in order to further allow picking them out of the wafer substrate and placing on the final system, for example, a printed circuit board. However, the dicing of the thin system may be sensitive, and the single die may be damaged during this step. Moreover, the so prepared thin and flexible die may be manipulated using sophisticated pick and place tools and assembled on a flexible substrate. The fragility of the thin die and the sophisticated methods and tools used for carrying out these steps may render this process flow costly.

A further method for the fabrication of flexible electronic devices involves the Pick, Crack & Place® method, developed according to the Chipfilm™ technique to mount flexible die on a flexible substrate. In particular, according to this method, pre-processed wafer substrates having narrow cavities underneath the intended chip areas are fabricated. The cavities are formed at such a depth to obtain flexible die by fracturing the chip areas from the wafer at the level of the cavities. CMOS devices are formed in the chip areas, and trench etch is performed along the chip sides leaving anchors near the edges of the chips. Flexible die are thus obtained and processed by Pick, Crack & Place® in order to assemble the thin flexible dice on a flexible substrate. Also in this case, thin and flexible die are handled by the Pick, Crack & Place® method. The die may be easily damaged, and the method may be costly and difficult to carry out. Moreover, the realization of the electronic connections is also difficult because the thin and flexible die cannot be handled with high accuracy so that the positioning of the flexible dice at the correct connection positions is not readily realized.

SUMMARY OF THE INVENTION

In the light of the above mentioned potential issues, a method for the fabrication of flexible electronic devices that may provide an approach to the issues may be desirable. In particular, an inexpensive method for the fabrication of flexible electronic devices may be desired. Moreover, a method for the fabrication of flexible electronic devices, which can be easily carried out, for example, by way of standard handling and packaging tools, may be required.

The present disclosure may include handling thick semiconductor devices having a thickness such that they are not flexible, and thinning the semiconductor devices so as to render them flexible only after they have been bonded and electrically coupled on a flexible substrate previously provided with the appropriate electrical connections. Handling thick semiconductor devices, whose thickness is such that they are not flexible, may be easier and less costly than handling flexible semiconductor devices. Accordingly, the present disclosure may provide an inexpensive and efficient method for the fabrication of flexible electronic devices. In particular, the present disclosure may provide a method for the fabrication of flexible electronic devices that does not require complex equipments and tools suitable to handle fragile flexible semiconductor devices. The present disclosure may provide a method that can be readily carried out by way of typical equipments and tools, such as standard packaging tools, which are suitable to handle thick semiconductor devices whose thickness is such that they are not flexible.

According to an embodiment, a method for the fabrication of a flexible electrical device is provided. The method may comprise providing a flexible substrate, providing the flexible substrate with one or more flexible substrate electrical connections, and providing at least a semiconductor device, the semiconductor device comprising a substrate region and an active region. The active region may comprise one or more semiconductor device electrical connections, and the semiconductor device may have a thickness such that the semiconductor device is not flexible. The method may include bonding the semiconductor device on the flexible substrate so that at least one of the flexible substrate electrical connections is coupled with one of the semiconductor device electrical connections, and thinning the substrate region of the semiconductor device so as to render the semiconductor device flexible, where the thinning being performed after the bonding.

According to another embodiment, a method is provided where the flexible substrate is kept stiff during the bonding and the thinning of the semiconductor devices. Keeping the flexible substrate stiff during bonding and thinning of the semiconductor devices may ease these processes, for example, allowing the use of standard equipments and tools, and reduce the probability of damaging the flexible substrate during these processes.

Additionally, in another embodiment, a method is provided where the flexible substrate may be provided on a temporary rigid carrier substrate so as to be kept stiff. The flexible substrate may be formed on a carrier substrate using spin coating, for example. Alternatively, the flexible substrate may be bonded on the carrier substrate after having been formed by way of a temporary adhesive layer. Forming the substrate in a stiff configuration or providing it in the stiff configuration immediately after its formation may be advantageous because it eases the handling of the flexible substrate and reduces the probability of damaging it. For example, active layers and electrical connections formation may be performed while the flexible substrate is kept stiff so as to ease these processes.

According to one embodiment, a method is provided further comprising removing the carrier substrate after the thinning. In this way, the carrier substrate is kept stiff during the execution of the method according to the present disclosure. In particular, the carrier substrate is thus kept stiff until the semiconductor device is thinned, so as to improve the handling of the system and to reduce the probability of damaging the flexible substrate.

According to one embodiment, a method is provided where the flexible substrate is kept stiff by a system of rollers in a roll-to-roll manufacturing line. The system of rolls may allow for removing the carrier substrate. This approach may be advantageous, for example, for large area applications.

In a further embodiment, a method is provided where the thickness of the semiconductor device prior to the thinning is 100 micrometers or more, preferably 500 micrometers or more, and the thickness of the semiconductor device after the thinning may be less than 100 micrometers, for example, 50 micrometers or less, preferably 20 micrometers or less. Semiconductor devices having a thickness of 100 micrometers or more are particularly easy to handle. In particular, they can be easily handled by standard packaging tools. Semiconductor devices having a thickness of 50 micrometers or less are flexible.

In yet another embodiment, a method is provided where the providing of at least one semiconductor device comprises providing a plurality of semiconductor devices on a semiconductor wafer and dicing the semiconductor wafer so as to obtain a plurality of die, the semiconductor device corresponding to one of the die. In particular, according to the present disclosure, a plurality of die may be provided, where each of the die comprises an active region and a substrate region, the active region comprising one or more electrical connections. Each of the die may have a thickness such that the single die is not flexible. Each of the die is bonded on the flexible substrate so that at least one of the electrical connections of the die is coupled with one of the electrical connections of the flexible substrate. Finally, each of the die is thinned so as to be rendered flexible, and the thinning is performed after the bonding. For example, the plurality of dice may be formed on a single semiconductor wafer, which is subsequently diced in order to form the die.

According to one embodiment, a method is provided where the step of providing the flexible substrate with one or more flexible substrate electrical connections comprises bumping so as to form connecting bumps on the flexible substrate for connecting the flexible substrate electrical connections.

Additionally, a method is provided where the providing of at least one semiconductor device comprising a substrate region and an active region comprising one or more semiconductor device electrical connections comprises bumping so as to form connecting bumps on the semiconductor device for connecting the semiconductor device electrical connections. A method is provided where the substrate region of the semiconductor device may comprise a sacrificial layer and the thinning comprises etching the sacrificial layer. In this way, the substrate region may be easily fractured at the sacrificial layer.

In some embodiments, a method is provided where the thinning may comprise a wet chemical etch or spin etch of the substrate region. Additionally, a method is provided where the thinning may comprise Smart Cut® of the substrate region.

Also, a method is provided where the thinning may comprise rendering porous at least a portion of the substrate region. The porous portion may be subsequently oxidized and etched so as to easily fracture the substrate region at the porous portion.

In one embodiment, a method is provided where the thinning may comprise protecting the active region during the thinning so as to avoid damaging the active region. In this way, the formation of defects may be reduced, and the functionality of the semiconductor devices may be guaranteed.

According to another embodiment, a method is provided where protecting the active region during the thinning may comprise forming a protective layer after the bonding, the protecting layer encapsulating the semiconductor device, and exposing the bottom of the semiconductor device by way of openings through the protective layer. Once the bottom of the semiconductor device is exposed, it can be easily etched while, at the same time, the active region of the device is safely encapsulated by the protecting layer.

Moreover, a method is provided where protecting the active region during the thinning comprises: providing a container for a etch bath, the container comprising at least an opening at the bottom, and placing the container in proximity of the semiconductor device so that the upper surface of the substrate region of the semiconductor device closes the opening so as to prevent the vapor that may form in the etch bath from reaching the active region of the semiconductor device. Furthermore, the substrate region of the semiconductor device may be provided with opening vias extending from the upper surface of the substrate region to a sacrificial layer placed in the substrate region so that the etch bath can reach the sacrificial layer through the opening vias so as to fracture the substrate region.

According to yet another embodiment, a method is provided where the semiconductor device may be manufactured using a silicon on insulator (SOI) technology. Additionally, a method is provided where the thinning may comprise etching the insulator layer of the SOI device. In this way, the substrate region may be fractured at the insulator layer thus rendering the device flexible in a simple and effective way.

According to an embodiment, a method is provided where the semiconductor device may be manufactured using a CMOS technology. Moreover, a method is provided where the semiconductor device may be manufactured using a mixed technology, such as but not limited to the BCD (Bipolar, CMOS and DMOS) technology. The semiconductor device may thus comprise one or more BCD transistors. For example, the flexible substrate may comprise at least one of: polyimide (PI), flexible steel, polyether ether ketone (PEEK), polyethylene naphthalate (PEN) or polyethylene terephthalate (PET).

BRIEF DESCRIPTION OF THE DRAWINGS

The present disclosure is described with reference to the enclosed figures wherein the same reference numbers relate to the same features and/or to similar features and/or to corresponding features of the system. In the figures.

DETAILED DESCRIPTION OF THE PREFERRED EMBODIMENTS

In the following, the present disclosure is described with reference to particular embodiments as shown in the enclosed drawings. Nevertheless, the present disclosure is not limited to the particular embodiments described in the following detailed description and shown in the figures, but, instead, the embodiments described simply exemplify several aspects of the present disclosure, the scope of which is defined by the appended claims. Further modifications and variations of the present disclosure may be clear for the person skilled in the art. Therefore, the present description has to be considered as including all the modifications and/or variations of the present disclosure, the scope of which is defined by the appended claims.

Figure 1:
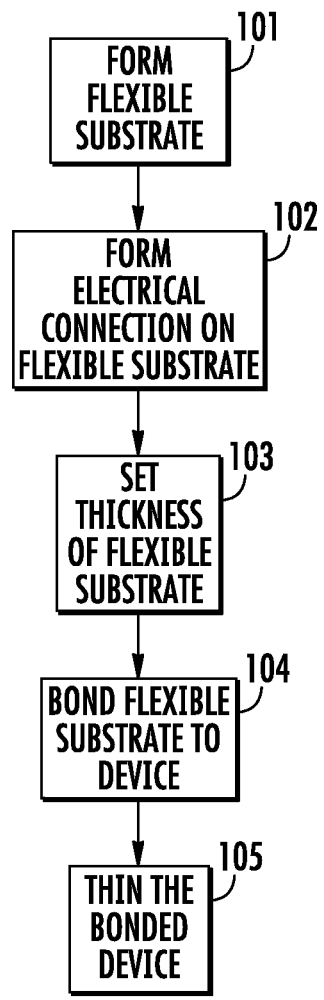
FIG. 1 is a flow chart of a method, according to an embodiment of the present disclosure.
Figure 2A:
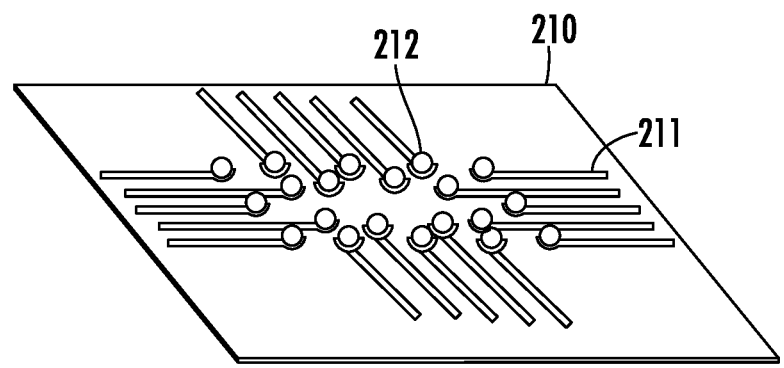
FIG. 2A is a schematic perspective view of a flexible substrate, according to an embodiment of the present disclosure.

FIG. 1 shows a flow chart of a method for the fabrication of a flexible electronic device according to an embodiment of the present disclosure. A flexible substrate is provided at step 101. An example of a flexible substrate 210 is schematically shown in FIG. 2A. Examples of materials suitable for the provision of a flexible substrate 210 comprise polyimide (PI), flexible steel, polyether ether ketone (PEEK), polyethylene naphthalate (PEN) or polyethylene terephthalate (PET). The choice of the material may depend, for example, on the kind of application. Moreover, the choice of the material may also depend on the conditions the flexible material is subject to, for example, during the steps of the fabrication method. The choice of the material for the flexible substrate can be based, for example, on the temperatures involved in the steps of the fabrication method. For example, polyether ether ketone (PEEK) is stable at temperatures up to 200° C., polyethylene naphthalate (PEN) is stable at temperatures up to 150° C. and polyethylene terephthalate (PET) is stable at temperatures up to 70° C.

Polyimide (PI) may be advantageous because it is a flexible material exhibiting several optimum properties for the application as flexible substrate for flexible electronic devices. Polyimide (PI) has low dielectric constant, and its surface can be polished to the Angstrom level. It also has excellent dimensional stability and exhibits low water absorption, high temperature stability (maximum operating temperature 400° C.), excellent processability, low outgassing, exceptional mechanical strength, and a low coefficient of thermal expansion.

Moreover, PI and PEEK have the advantage of a very low outgassing with respect to PEN and PET. PEN and PEEK have higher operating temperature than PET. PI has higher operating temperature than PEN, PEEK and PET. PET has lowest cost than the other substrates.

The flexible substrate 210 may have a thickness T2 in the range between a few micrometers (for example, 2 micrometers) and 100 micrometers or more. More specifically, the thicknesses of the flexible substrate 210 is selected according to the application requirements, as well as on the basis of manufacturability, transparency and other physical characteristics of the same substrate.

The flexible substrate is provided with one or more flexible substrate electrical connections at the step 102. For example, the flexible substrate 210 shown in FIG. 2A is provided with a plurality of flexible substrate electrical connections 211. The electrical connections 211 may comprise, for example, metal strips. The flexible substrate electrical connections 211 may comprise flexible interconnects, such as, for example, those provided by Piralux® or LeitOn® interconnects. The arrangement of the flexible substrate electrical connections 211 on the flexible substrate is designed according to the final architecture of the flexible electronic device.

The flexible substrate 210 may be provided with active layers such as sensors, antennas and printed electronic circuits. Printed electronic circuits are obtained by exploiting either typical techniques compatible with flexible plastic substrates or by extending dedicated printing techniques, such as inkjet printing, screen printing, gravure printing, soft lithography and nano-imprint lithography, used to fabricate electronic devices and their interconnections. For example, typical fabrication methods and their combination are disclosed in the Italian Patent Application No. VA2009A000054, titled: "LOW COST METHOD OF FABRICATION OF VERTICAL INTERCONNECTIONS COMBINED TO METAL TOP ELECTRODES."

The flexible substrate electrical connections 211 may be accordingly designed so as to provide the electrical connections to the active layers formed on the flexible substrate 210. The flexible substrate electrical connections 211 may be adapted to be coupled with the electrical connections of one or more semiconductor devices. In particular, in the example shown in FIG. 2A, the flexible substrate electrical connections 211 are provided with connecting bumps 212. The connecting bumps 212 form an interconnect-area array on the surface of the flexible substrate 210. The connecting bumps 212 may be provided by way of bumping processes. Examples of solder bump materials are 62% Sn/38% Pb with eutectic temperature 183° C., and lead-free solders, such as $Sn_{95.5}Ag_4Cu_{0.5}$ with eutectic temperature 217° C. Lead-free solders are preferable for environmental and health hazards reasons. PI substrates can be operated at temperatures up to 400° C. The connecting bumps 212 may be particularly advantageous for the realization of the electrical connection between the flexible substrate electrical connections and the electrical connections of one or more semiconductor devices which are to be placed on the flexible substrate 210.

Alternatively, the connecting bumps may be provided on the semiconductor device instead of providing them on the flexible substrate 210. For example, the connecting bumps may be formed on the outer surface of the semiconductor device in correspondence with the electrical connections of the semiconductor device. A semiconductor device is provided at the step 103 of the method schematically shown in FIG. 1.

The chronological order of the steps 101, 102 and 103 is not fixed. In particular, it is possible to perform the steps 101, 102 and 103 in this specific chronological order. Moreover, it is also possible to perform first the step 103, followed by the steps 101 and 102. Furthermore, it is also possible to perform the step 103 at the same time as the step 101 or at the same time as the steps 101 and 102.

Figure 2B:
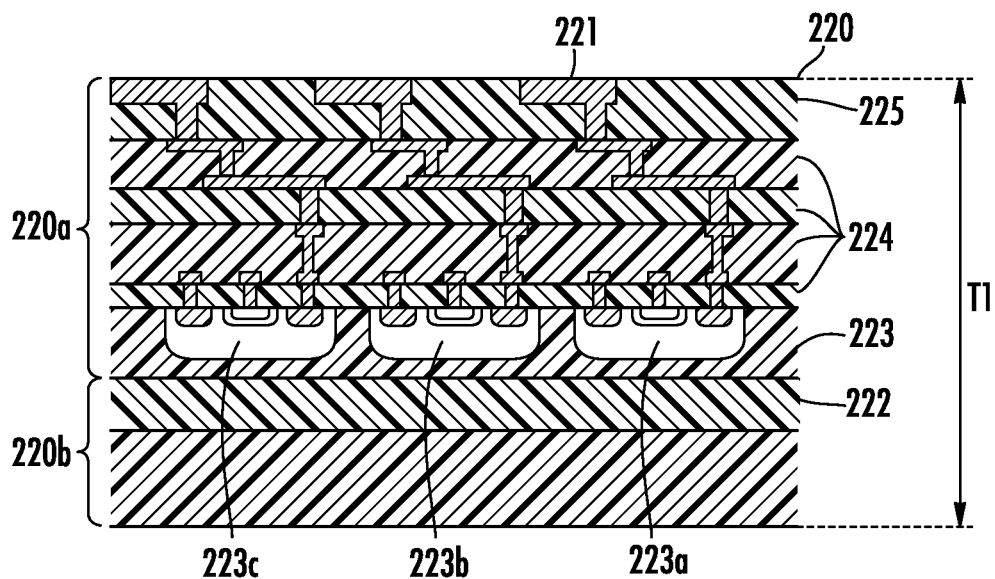
FIG. 2B is a schematic diagram of a cross-section view of a semiconductor device, according to an embodiment of the present disclosure.

An example of a semiconductor device 220 provided at the step 103 of the method shown in FIG. 1 is shown in FIG. 2B. The semiconductor device 220 comprises a substrate region 220b and an active region 220a. In particular, the substrate region 220b supports the active region 220a. The active region 220a is the region of the device comprising one or more of the active components of the semiconductor device. Moreover, the active region 220a comprises the electrical connections of the active components of the semiconductor device.

In the example shown in FIG. 2B, the active region 220a comprises a semiconductor active area layer 223. The layer 223 comprises one or more active components. The layer 223 may have a thickness comprised, for example, between 1 and 2 micrometers. In the example shown in FIG. 2B, the layer 223 comprises three active components 223a, 223b and 223c, for example, three transistors. The number of active components of the semiconductor active area layer is not limited to specific values. Moreover, the active region 220a further comprises a multi-level structure 224. The multi-level structure 224 may comprise a plurality of metallization layers alternated with inter-layer dielectric layers. The active region 220a further comprises a redistribution layer 225.

The active region 220a comprises one or more semiconductor device electrical connections. In particular, in the example shown in FIG. 2B, the active region 220a comprises three semiconductor device electrical connections 221. The semiconductor device electrical connections 221 provide the electrical connections to the active components of the semiconductor device 220. In particular, the semiconductor device electrical connections 221 are formed by properly engineering the multi-level structure 224 and the redistribution layer 225 so as to provide electrical connections between the upper surface of the semiconductor device 220 and the active components of the system through the multi-level structure 224 and the redistribution layer 225. The semiconductor device electrical connections 221 are thus adapted to electronically operate the active devices of the semiconductor device 220.

The electrical connections 221 may be further provided with connecting bumps by way of bumping processes. In particular, the electrical connections 221 are advantageously provided with connecting bumps in case the electrical connections of the flexible substrate 210 are not provided with connecting bumps.

The semiconductor device 220 may comprise, for example, integrated circuits manufactured with SOI technology or with another semiconductor manufacturing method, such as CMOS, BCD and other platforms. The semiconductor device 220 has a thickness T1. In particular, the thickness T1 is given by the sum of the thickness of the substrate region 220b and the thickness of the active region 220a.

The semiconductor device provided at the step 103 of the method shown in FIG. 1 has a thickness T1 such that the semiconductor device is not flexible. For example, the thickness T1 may be 100 micrometers or more. Thicknesses of 100 micrometers or more can be easily handled by standard handling tools. For example, the thickness T1 is 200 micrometers or more. For example, the thicknesses of Si wafers commercially available depends on the diameter of the wafer and range from 275 micrometers for 2 inches wafers (diameter: 50.8 mm) to 775 micrometers for 12 inches wafers (diameter: 300 mm).

A thickness T1 in the range of 100 micrometers may be advantageous because the device can be easily handled by standard handling tools and, at the same time, such a thickness can be easily achieved by grinding techniques starting from commercially available thicknesses. T1 is such that the semiconductor device is not flexible. The value of T1 can depend therefore on the lateral dimensions of the device. For example, in order to determine the minimum thickness at which the device is not flexible, it is appropriate to consider the Young's modulus of the material the device is made of. For example, silicon has a Young's modulus of 130-180 GPa (according to the direction along which it is measured) and GaAs 82.7 GPa. (For comparison: PI has a Young's modulus of 3.2 GPa and PEEK 3.6 GPa.).

Since the thickness T1 of the semiconductor device provided at the step 103 is such that the semiconductor device is not flexible, it may be easy to handle the semiconductor device. In particular, the semiconductor device having a thickness T1 such that it is not flexible can be easily handled by existing packaging tools, and no particular precautions should be taken, as would be the case for flexible semiconductor devices. In particular, the processes for handling flexible semiconductor devices are sensitive and may require the employment of expensive tools.

In the system shown in FIG. 2B, the substrate region 220b of the semiconductor device 220 comprises a sacrificial layer 222. The sacrificial layer 222 is placed below the semiconductor active area layer 223. For example, if the semiconductor device 220 is a SOI device, the sacrificial layer 222 may correspond to the insulator layer of the system.

Figure 3:
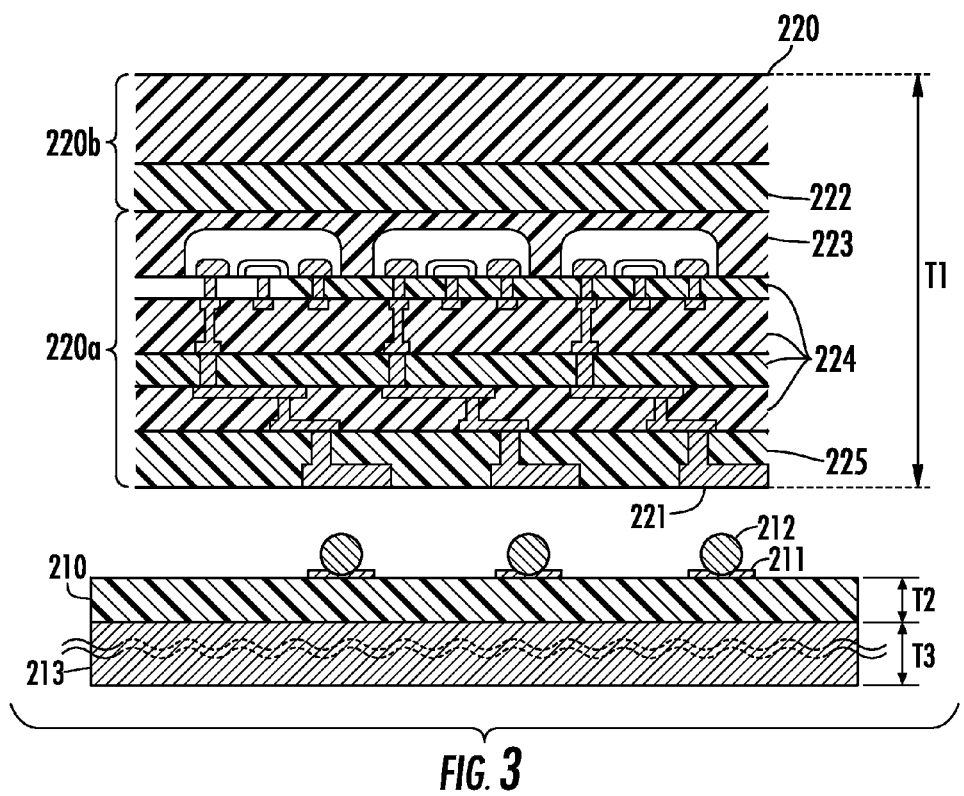
FIG. 3 is a schematic diagram of a cross-section view of a phase of the bonding step, according to an embodiment of the present disclosure where the semiconductor device of FIG. 2B is bonded on the flexible substrate of FIG. 2A.
Figure 4:
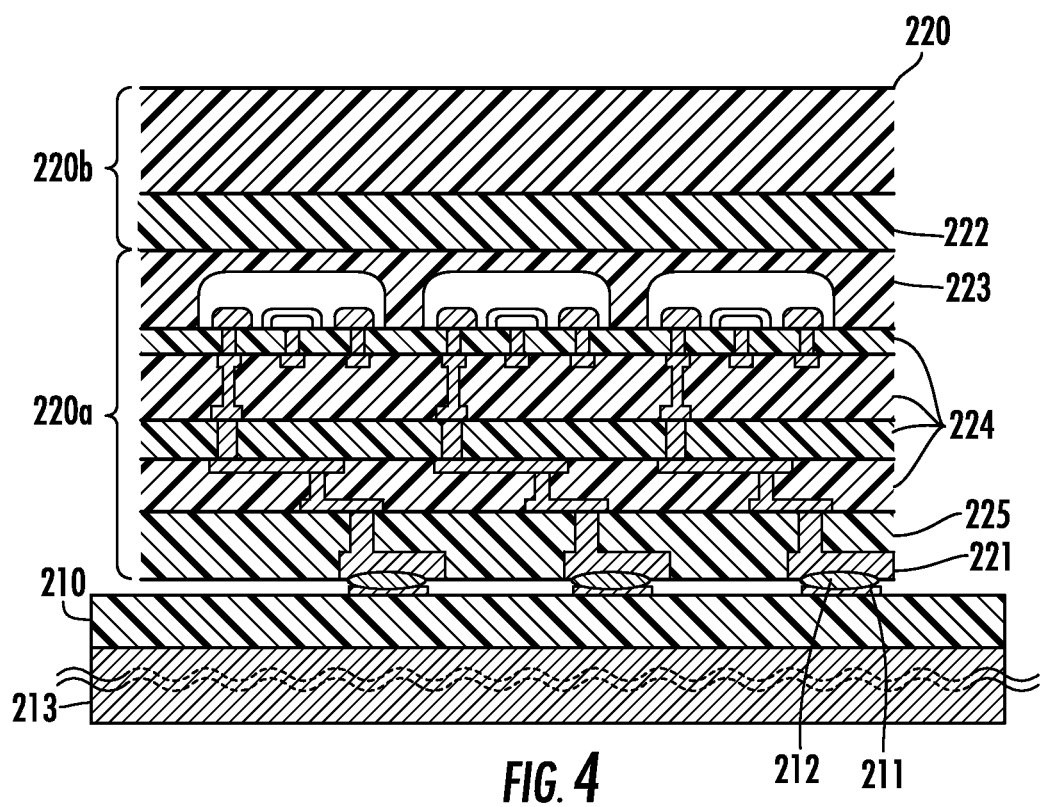
FIG. 4 is a schematic diagram of a cross-section view of results of the bonding step shown in FIG. 3.

At the step 104 of the method shown in FIG. 1, the semiconductor device provided at the step 103 and having a thickness such that it is not flexible is bonded on the flexible substrate provided at the step 101. Schematic examples of this method step are shown in FIGS. 3 and 4.

The bonding is performed in such a way that at least one of the flexible substrate electrical connections is coupled with one of the semiconductor device electrical connections. The semiconductor device 220 shown in FIG. 2B is flipped so that the upper surface of the device 220 comprising the semiconductor device electrical connections 211 faces the surface of the flexible substrate 210 comprising the flexible substrate electrical connections 211 and the connecting bumps 212. Moreover, the flipped semiconductor device 220 is positioned on the flexible substrate 210 such that the semiconductor device electrical connections 221 are coupled to the flexible substrate electrical connections 211. The connection may be realized via the connecting bumps 212. In this case, if the flexible substrate electrical connections 211 are provided with the connecting bumps 212, the semiconductor device 220 is placed on the flexible substrate 210 in such a way that one or more of the semiconductor electrical connections 221 is connectable with one or more of the flexible substrate electrical connections 211 via the connecting bumps 212. If the semiconductor electrical connections 221 are provided with connecting bumps, the semiconductor device 220 is placed on the flexible substrate 210 in such a way that one or more of the flexible substrate electrical connections 211 is connectable with one or more of the semiconductor electrical connections 221 via the connecting bumps.

The semiconductor device 220 may be bonded to the flexible substrate 210 by thermocompression bonding. Moreover, the semiconductor device 220 may be bonded to the flexible substrate 210 by an anisotropic conductive paste. The flexible substrate 210 is kept stiff during the bonding in order to facilitate this process.

The flexible substrate 210 may be provided on a carrier substrate 213 so as to be kept stiff. The carrier substrate 213 has a thickness T3 such that it is stiff and it carries the flexible substrate 210 in a stable way. For simplicity, the thicknesses T1, T2 and T3 schematically shown in FIG. 3 are not in scale. The thickness T3 may be, for example, in the range between 500 micrometers and 700 micrometers.

The carrier substrate 213 may comprise a semiconductor material. For example, the carrier substrate 213 may comprise a bulk silicon substrate. Moreover, the carrier substrate 213 may comprise a glass substrate. The flexible substrate may be bonded on the carrier substrate. Alternatively, the material forming the flexible substrate may be spin coated on the carrier substrate so as to form the flexible substrate. This can be performed, for example, at the step 101 of the method schematically shown in FIG. 1.

Furthermore, the flexible substrate 210 may be kept stiff by a system of rolls in a roll-to-roll manufacturing line. In particular, this approach may be employed in order to replace the carrier substrate 213. According to this approach, the flexible substrate 210 is stretched by a system of rollers so as to be kept stiff. This approach may be particularly advantageous, for example, for large area applications.

According to an embodiment of the present disclosure, the flexible substrate 210 may be kept stiff not only during the bonding of the semiconductor device 220 on the flexible substrate 210, but also during the step 102 of the method schematically shown in FIG. 1. In particular, the flexible substrate 210 may be kept stiff while providing it with one or more flexible substrate electrical connections so as to facilitate this process. Moreover, the flexible substrate 210 may be kept stiff also during the formation of active and passive devices and interconnection paths on the substrate itself. For example, the flexible substrate may be formed by spin coating on the carrier substrate at the step 101 so as to be provided in a stiff configuration which facilitates and speeds up the following processes, for example, the processes for providing active layers and/or electrical connections on the flexible substrate. Keeping the flexible substrate stiff during one or more of these procedures facilitates handling the flexible substrate and reduces the probability of damaging it during these procedures.

At the step 105 of the method schematically shown in FIG. 1, the substrate region of the semiconductor device already bonded on the flexible substrate is thinned so as to render the semiconductor device flexible. In particular, the thinning 105 is performed after the bonding 104. In other words, the semiconductor device is rendered flexible only after it has been bonded and electrically coupled on the flexible substrate.

The substrate region of the semiconductor device may be partially removed by the thinning 105. Alternatively, the substrate region of the semiconductor device may be completely removed by the thinning 105 so as to leave only the active region of the device.

The thickness T4 of the semiconductor device after the thinning 105 may be 50 micrometers or less. Preferably, the thickness of the semiconductor device after the thinning 105 is 20 micrometers or less. For example, the thickness of the semiconductor device after the thinning 105 may be in the range of 10 micrometers.

Figure 5:
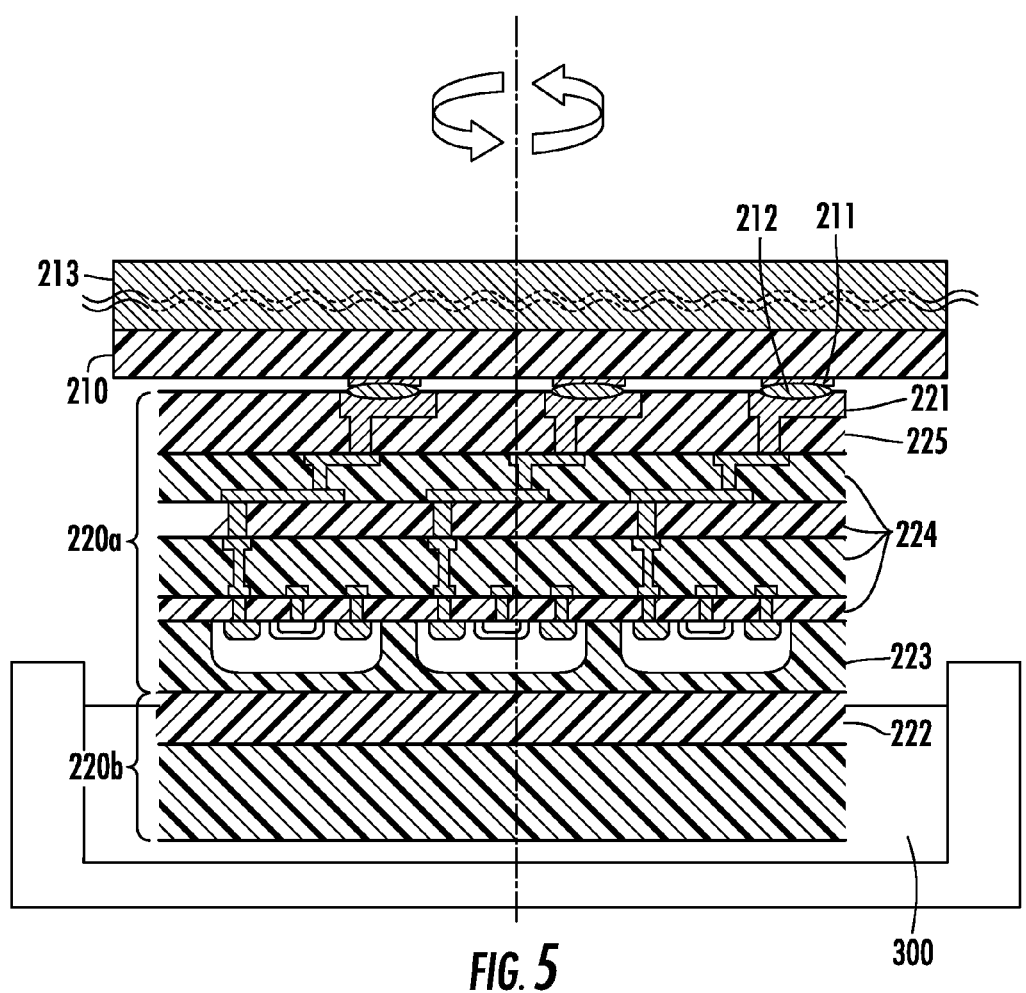
FIG. 5 is a schematic diagram of a cross-section view of a phase of the thinning process performed on the system shown in FIG. 4, according to an embodiment of the present disclosure.
Figure 6:
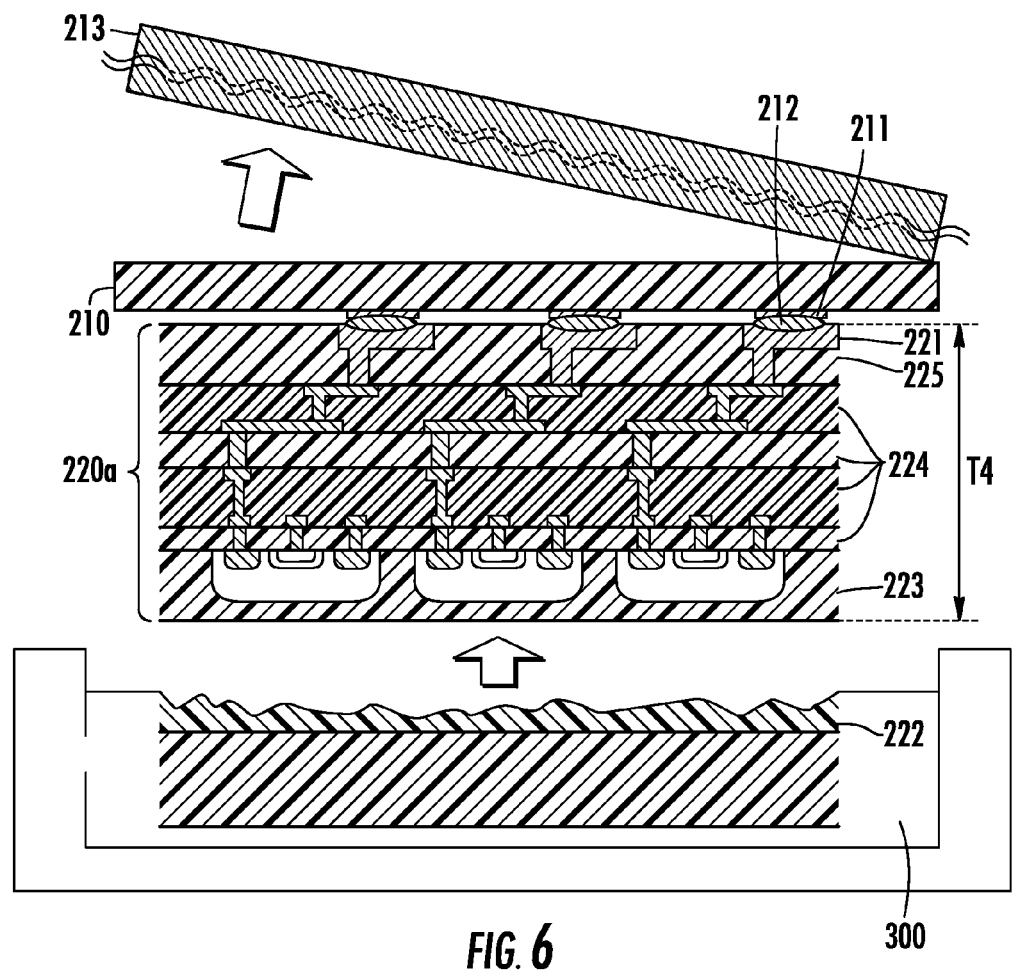
FIG. 6 is a schematic diagram of a cross-section view of further steps of the method, according to an embodiment of the present disclosure.

FIGS. 5 and 6 show an example of the thinning process 105 performed on the system so as to render the semiconductor device 220, bonded and electrically coupled on the flexible substrate 210, flexible. In the example shown in FIGS. 5 and 6, the substrate region 220b of the semiconductor device 220 is etched. In particular, the substrate region 220b of the semiconductor device 220 is immersed into an etching bath 300. The etching bath 300 is such that the sacrificial layer 222 of the substrate region 220b is etched so as to detach the substrate region 220b from the active region 220a. The components of the etching bath 300 are chosen according to the specific kind of material to be etched. For example, in the case of a SOI device where the sacrificial layer 222 corresponds to a silicon oxide layer, the etching bath 300 may comprise hydrofluoric acid (HF). In general, the substrate region 220b of the semiconductor device 220 may comprise a sacrificial layer 222 so that the semiconductor device 220 is thinned and rendered flexible by etching the sacrificial layer 222. In the case of wet etching, the composition and physical conditions of the etching bath are chosen in order to effectively etch the sacrificial layer 222.

According to an embodiment, the thinning 105 comprises protecting the active region 220a of the semiconductor device 220 during thinning so as to avoid damaging the active region 220a. For example, in the case of wet etching of the substrate region 220b of the semiconductor device 220 in the etch bath 300, vapors may develop, which damage the active region 220a of the semiconductor device 220. For instance, in the case of SOI systems where the insulator layer comprises an oxide layer, which is employed as sacrificial layer for the thinning 105, a hydrofluoric acid (HF) bath may be employed. The HF vapors that may develop from the HF bath could possibly damage inter-metal dielectric layers, which are present in the active region 220a. Accordingly, protection of the active region 220a may be advantageous.

Figure 7:
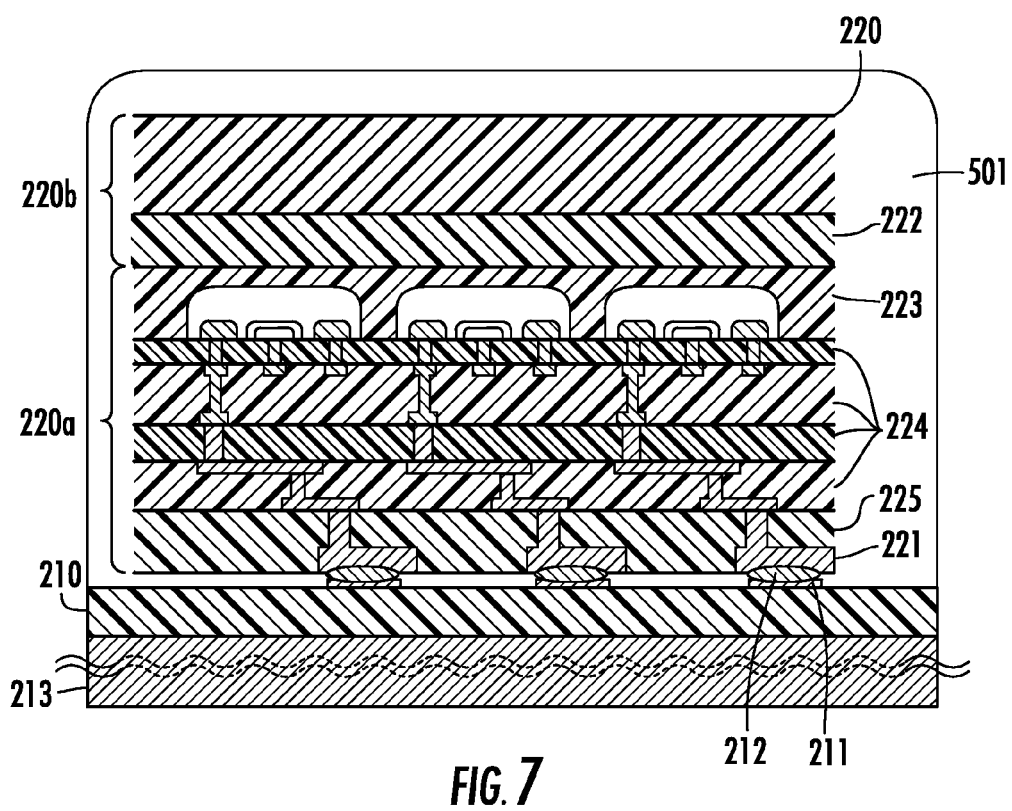
FIG. 7 is a schematic diagram of a cross-section view of a phase of the thinning process performed on the system shown in FIG. 4, according to a further embodiment of the present disclosure.

In order to protect the active region 220a, a protective layer 501 may be formed on the system after the bonding 104. The protective layer 501 may encapsulate the semiconductor device, which is bonded and electrically coupled on the flexible substrate after the bonding 104. In particular, the protective layer 501 may cover not only the back surface of the semiconductor device, but also the lateral surfaces of the device as schematically shown in FIG. 7. The protective layer 501 may comprise a material which is resistant to the etching agents employed for the thinning 105. The protective layer 501 may comprise, for example, a polymeric layer. The protective layer 501 may comprise, for example, photoresist or poly(methyl methacrylate) (PMMA). The protective layer 501 may be formed, for example, after a pre-thinning step. In particular, the semiconductor device may be pre-thinned by mechanical grinding before or after the bonding step 104.

Figure 8:
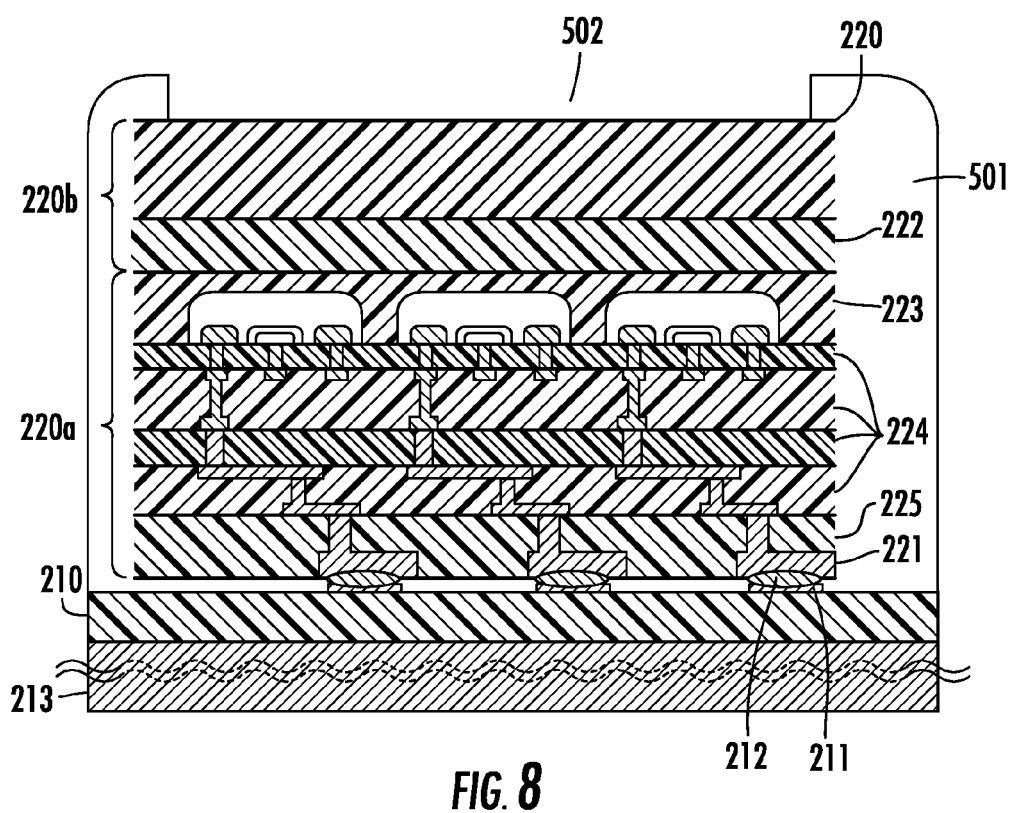
FIG. 8 is a schematic diagram of a cross-section view of a further phase of the process shown in FIG. 7.

After the deposition of the protective layer 501, as shown in FIG. 7, apertures 502 are selectively formed in the protective layer 501 so as to expose the bottom surface of the semiconductor device, as shown in FIG. 8. For this purpose, solvent materials suitable for removing the protective layer may be locally deposited on the system, for example, by InkJet printing techniques. Once the bottom surface of the semiconductor device is exposed, the substrate region 220b of the device is etched, for example, by anisotropic etching agents. This etching may be performed in order to reach the sacrificial layer 222 of the substrate region 220b. Once the sacrificial layer 222 has been reached, etching of this layer is performed. For example, in the case of a SOI system, the oxide layer may be etched by using HF.

The active region 220a of the device is protected by the protective layer 501 during these steps, so that the probability of damaging the active region 220a is strongly reduced. According to one embodiment, protection of the active region 220a is achieved by a device housing for the etching bath. The device housing is located at the bottom of the container of the etching bath, and it is such that the semiconductor device can be housed in the device housing so that only the substrate region of the semiconductor device is exposed while the active region is protected by the housing.

Figure 9:
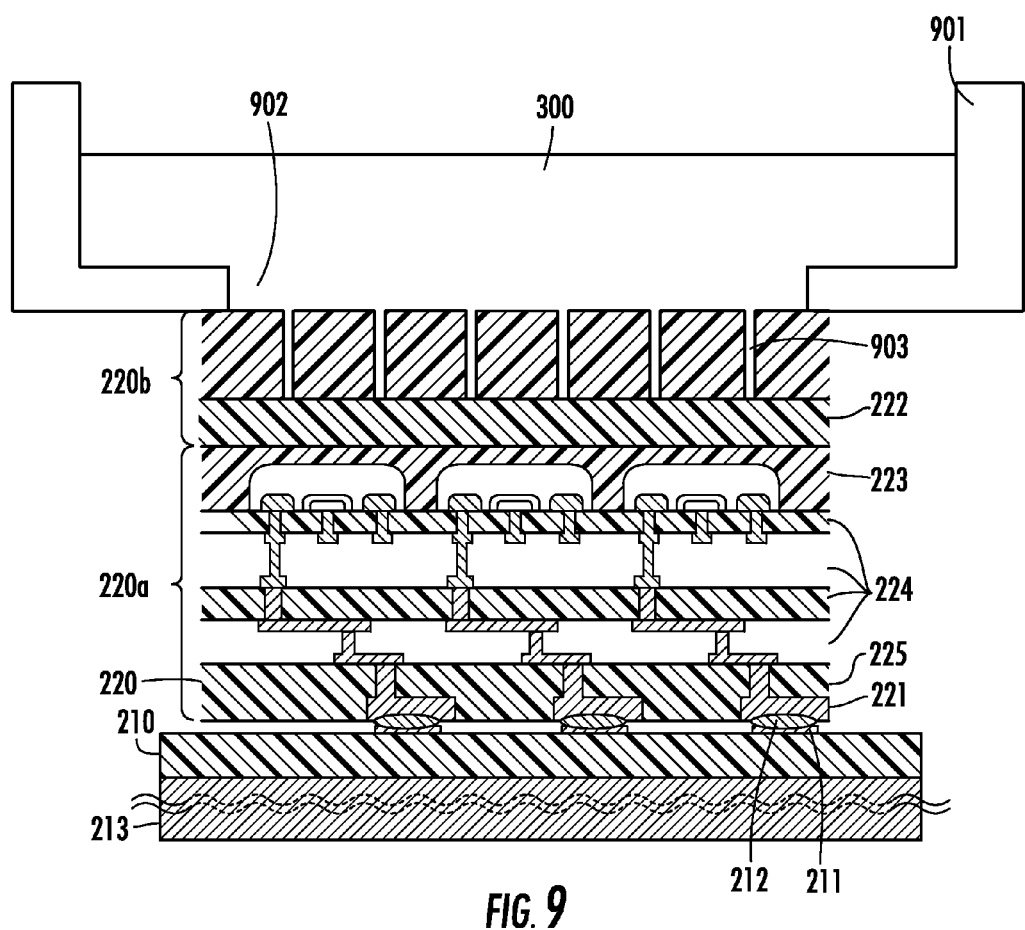
FIG. 9 is a schematic diagram of a cross-section view of a phase of the thinning process performed on the system shown in FIG. 4, according to a further embodiment of the present disclosure.

An example of such an embodiment is shown in FIG. 9. The semiconductor device 220 is provided at the bottom of the container 901 so that only the substrate region of the semiconductor device is exposed to the etching bath 300. In particular, the bottom of the container 901 comprises an opening 902. The semiconductor device 220 is placed so that the upper surface of the substrate region 220b closes the opening 902 of the container 901.

The substrate region 220b of the semiconductor device 220 is provided with a plurality of vias 903 adapted to expose a sacrificial layer 222 provided in the substrate region 220b. The vias 903 can be formed, for example, by retro-etching the pre-thinned semiconductor substrate. The density of vias may range, for example, from 1 via/1 µm$^2$ ($10^6$ vias/m$^2$) to 1 via/100 µm$^2$ ($10^4$ vias/m$^2$). The vias extend from the upper surface of the substrate region 220b to the sacrificial layer 222.

Figure 10:
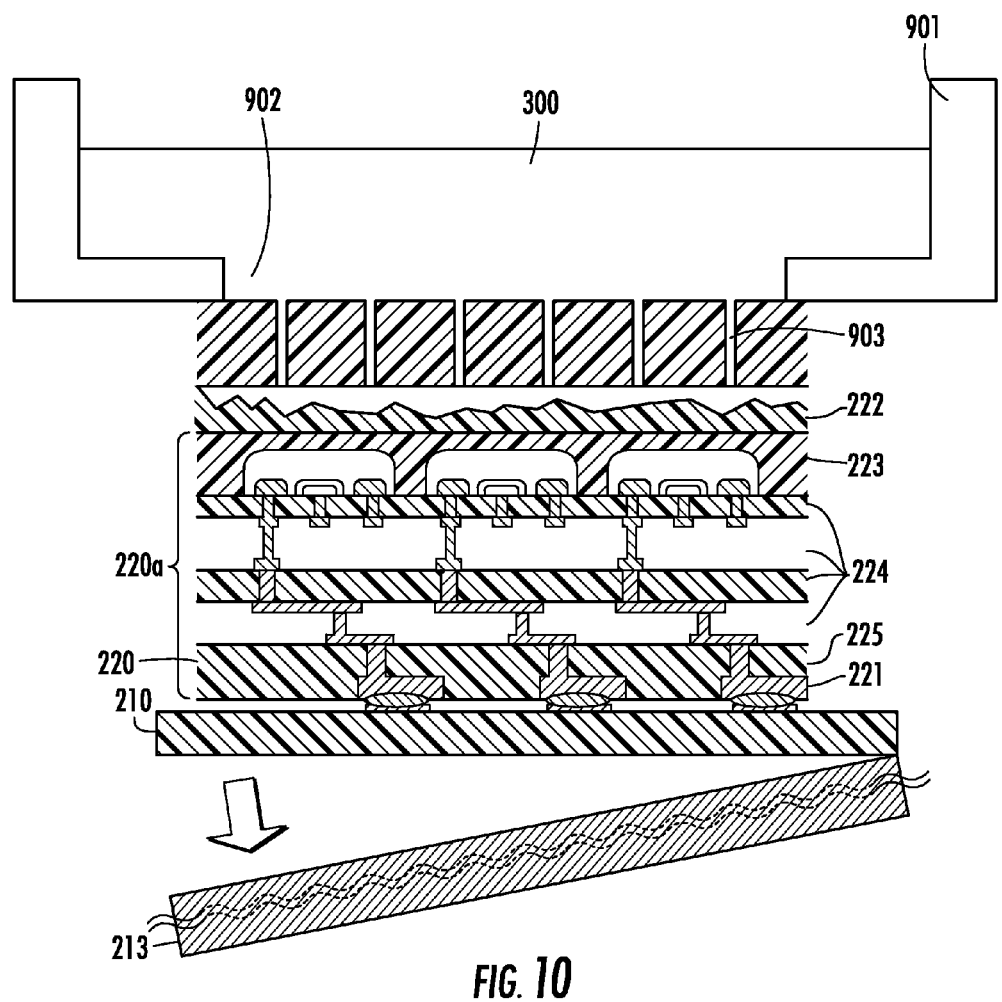
FIG. 10 is a schematic diagram of a cross-section view of a further phase of the process shown in FIG. 9.

The container 901 is subsequently filled with the etch bath 300. The etch bath can thus reach the sacrificial layer 222 by way of the vias 903 so as to detach the active region 220a from the substrate region 220b by fracturing the substrate region 220b at the sacrificial layer 222 as shown in FIG. 10. Since the opening 902 of the housing 901 is closed by the upper surface of the substrate region 220b of the semiconductor device 220, the vapors, which may develop from the etch bath, do not reach the active area 220a of the device. The thinning 105 by etching can be performed not only by a wet chemical etching in an etching bath, but also by spin etching, where a thin stream of an etching agent is moved periodically over the surface of the rotating wafer, or by dry etching techniques, for example, by Deep Reactive Ion Etching (DRIE).

In the case of spin etching, the sacrificial layer 222 of the substrate region 220b of the semiconductor device 220 may be advantageously employed as stop etch layer. The thinning 105 may also comprise Smart Cut® processes. Examples of such processes are disclosed, for example, in U.S. Pat. Nos. 5,374,564 and 5,882,987. H ions are implanted in the substrate region 220b of the semiconductor device 220. The system is then annealed so as to fracture the substrate region 220b in correspondence with the implanted hydrogen layer. In other words, the fracture occurs at the implanted hydrogen layer. The annealing can be up to a temperature of 300° C.-400° C. Nevertheless, effective annealing can be also performed at temperatures up to 250° C. This lower temperature annealing may be particularly advantageous in the present application, where the thinning 105 is performed after the bonding 104 because the annealing up to 250° C. does not damage the electrical contacts between the flexible substrate electrical connections and the semiconductor device electrical connections. In particular, annealing up to 250° C. does not damage, for example, the connecting bumps.

The thinning 105 may also comprise rendering porous at least a portion of the substrate region 220b of the semiconductor device 220. Examples of such thinning processes can be found for instance in European Patent Document No. EP 1 215 476 A2 and in U.S. Pat. No. 6,743,654. The portion of the substrate region 220b may be rendered porous, for example, before the bonding 104. The portion of the substrate region may be rendered porous by way of electrochemical processes. After the bonding 104, the porous portion of the substrate region 220b may be oxidized and chemically etched so as to fracture the substrate region 220b at the porous portion in order to perform the thinning 105 and to render the semiconductor device 220 flexible. Rendering porous at least a portion of the substrate region 220b may be advantageous, for example, for systems different from SOI systems. In particular, since these systems are not provided with an insulator layer that can be employed as sacrificial layer, a portion of the substrate region of these systems may be rendered porous so as to purposely form a sacrificial layer. In other words, the porous portion of the substrate region corresponds to a sacrificial layer which eases the thinning process 105. The porous portion in the substrate region may be such that the semiconductor device 220 is thinned and rendered flexible by fracturing the substrate region 220b of the semiconductor device 220 at the porous portion. Furthermore, the porous portion can be also provided in systems provided with a sacrificial layer, such as, for example, SOI systems where the insulator layer acts as sacrificial layer, in order to ease and speed up the etch rate of the sacrificial layer.

The thinning 105 employed for rendering the semiconductor device 220 flexible after the bonding 104 may not be the only thinning process the semiconductor device 220 is subject to. For example, the semiconductor device 220 may be pre-thinned before the bonding 104. Nevertheless, the thickness of the semiconductor device 220 after the pre-thinning is such that the semiconductor device 220 is not flexible. The semiconductor device 220 may be, for example, a die obtained from a pre-thinned wafer. Pre-thinning may be performed by typical thinning techniques, such as mechanical grinding, chemical mechanical polishing (CMP), wet etching, atmospheric downstream plasma (ADP), and dry chemical etching. The thickness of the semiconductor device 220 after pre-thinning may be in the order of magnitude of 100 micrometers, for example, between 200 micrometers and 300 micrometers.

The flexible substrate 210 may be kept stiff during thinning 105. In particular, as shown in FIG. 5, the flexible substrate 210 may be supported by the carrier substrate 213 during thinning. After the thinning, the now flexible semiconductor device 220 remains stuck on the flexible substrate 210. In the example shown in FIGS. 5 and 6, the flexible semiconductor device 220 is on the flexible substrate 210 which, in turn, is kept stiff by the carrier substrate 213. The system comprising a carrier substrate 213, flexible substrate 210 and a flexible semiconductor device 220 is therefore still stiff.

As schematically shown in FIGS. 6 and 10, the carrier substrate 213 is removed after the thinning. In particular, the carrier substrate 213 is de-bonded from the flexible substrate 210. For example, the carrier substrate 213 may be de-bonded by wet etching or by delamination. The carrier substrate 213 may be then used again for repeating the process in order to obtain further flexible electronic devices or for further processes.

Figure 11:
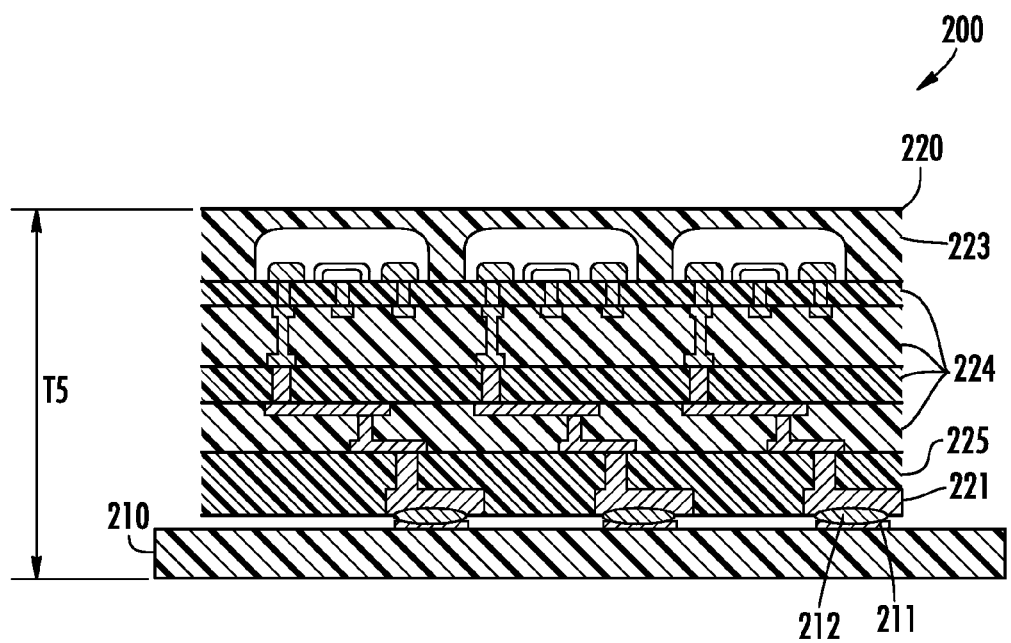
FIG. 11 is a schematic diagram of a cross-section view of a flexible electronic device, according to an embodiment of the present disclosure.

The system obtained after the removal of the carrier substrate 213 is flexible. An example of such a flexible electronic device 200 is shown in FIG. 11. The flexible electronic device 200 has a total thickness T5. The total thickness T5 of the flexible electronic device 200 may be in the range between 15 micrometers and 150 micrometers.

Even if the process has been described with respect to a single semiconductor device, the present disclosure may be carried out on a plurality of semiconductor devices. For example, a plurality of semiconductor devices may be provided on a semiconductor wafer, and the wafer may be diced so as to obtain a plurality of dice. The thickness of the die obtained after dicing is such that each of the die is not flexible. Each of the die corresponds thus to a semiconductor device and may be used according to the steps as described above for forming a flexible electronic device comprising a plurality of flexible semiconductor devices. The dicing is thus performed before the bonding 104. The die have a thickness such that they are not flexible and are accordingly easily handled and bonded on the flexible substrate. The die are thinned after bonding so as to be rendered flexible. Operating on the die may be advantageous. For example, the thinning may be easy and quick. Thinning the single die after bonding so as to render it flexible requires, in fact, a shorter time than thinning the whole semiconductor wafer after the formation of the die.

Figure 12:
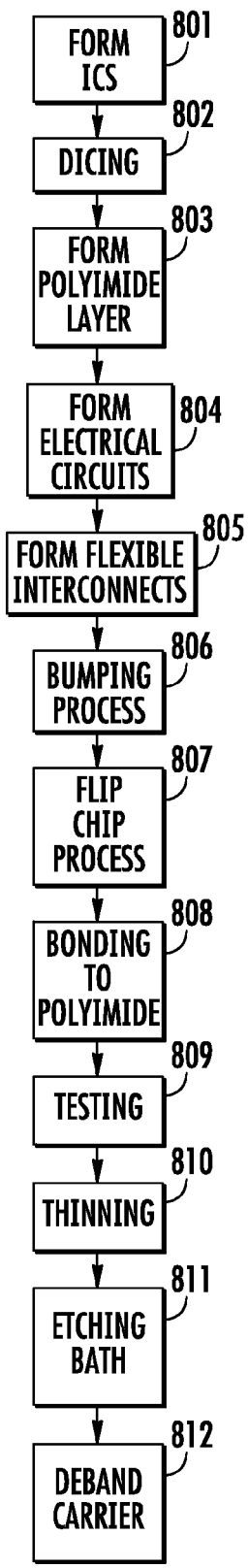
FIG. 12 is a flow chart of a method, according to a further embodiment of the present disclosure.

FIG. 12 schematically shows a flow chart of a method according to a particular embodiment of the present disclosure. The method shown in FIG. 12 may be adopted, for example, for providing a semiconductor silicon based technology integrated on flexible substrates. In other words, the method shown in FIG. 12 may be adopted for providing silicon on flexible substrate technology. Integrated circuits are manufactured on a SOI layer at the step 801.

At the step 802, Electrical Wafer Sort (EWS) is performed to verify which of the integrated circuits work properly. Moreover, at the step 802, dicing is performed in order to obtain the single die. Each of the die has a thickness such that the dice is not flexible. At the step 803, polyimide is spin coated or bonded on a silicon wafer carrier so as to form a layer of polyimide on the carrier.

At the step 804, active layers such as sensors, antennas, printed electronic circuits and so on, are manufactured on the polyimide substrate. At the step 805, flexible interconnects, such as Piralux® or LeitOn®, are provided on the polyimide substrate so as to form the appropriate electric connections for the active layers formed on the polyimide substrate.

At the step 806, the electric connections of the polyimide layer are provided with connecting bumps by bumping processes. The locations of the connecting bumps are engineered in order to correspond to the positions of the electric connections of the die, which may be bonded on the polyimide substrate.

The steps 803 to 806 may be performed after the steps 801 and 802. Alternatively, the steps 803 to 806 may be performed before the steps 801 and 802. Moreover, the steps 803 to 806 may be performed at the same time, i.e. in parallel, as the steps 801 and 802.

At the step 807, one or more of the dice obtained at the step 802 is flipped and placed on the polyimide substrate obtained after the steps 803 to 806 (flip chip process). The die is placed on the polyimide substrate in such a way that one or more of the electrical connections of the die are in electric contact with one or more of the electrical connections of the polyimide substrate, for example, by way of the connecting bumps. At the step 808, each of the die is placed on the polyimide substrate at the step 807 is bonded to the polyimide substrate, for example, by using thermocompression bonding or of anisotropic conductive pastes.

At the step 809, each of the die bonded on the polyimide substrate at the step 808 is tested so as to verify its functionality. At the step 810, thinning is performed so as to render the one or more of the die bonded on the flexible substrate of polyimide flexible. This step (i.e. step 810) is performed after the bonding (i.e. after the step 808). In particular, the process of thinning the die to a thickness that they are flexible is performed after the die are bonded on the flexible substrate. In this way, the bonding process is performed employing stiff die, which are easily handled and bonded, for example, by existing inexpensive tools.

At the step 810, the system may be immersed in an etching bath, by considering also the advantageous embodiments described before so as to avoid damages to the integrated circuits, so as to etch the oxide layer of the SOI structures. For example, the etching bath may comprise hydrofluoric acid (HF). At the step 811, the bare integrated circuits remain on the polyimide substrate, and the system is removed from the etching bath. At the step 812, the silicon wafer carrier is de-bonded from the polyimide layer. De-bonding may be performed, for example, by wet etching or of delamination.

Flexible electronic devices are thus obtained. In particular, according to the method schematically shown in FIG. 12, flexible silicon integrated circuits are obtained on the flexible polyimide substrate. While the embodiments have been described with respect to the preferred physical embodiments constructed in accordance therewith, it may be apparent to those skilled in the art that various modifications, variations and improvements of the present disclosure may be made in the light of the above teachings and within the ambit of the appended claims without departing from the spirit and intended scope of the invention. For example, the thicknesses of the system involved are not restricted to the explicit examples described.

Moreover, the number of semiconductor devices bonded and electrically coupled on the flexible substrate is not limited. In particular, the method according to the present disclosure may be performed on a plurality of dice. A plurality of dice is provided, wherein each of the die comprises an active region and a substrate region, the active region comprising one or more electrical connections. Each of the die has a thickness such that the die is not flexible. Each of the die is bonded on the flexible substrate so that at least one of the electrical connections of the die is coupled with one of the electrical connections of the flexible substrate. Finally, each of the die is thinned so as to be rendered flexible, and the thinning is performed after the bonding. For example, the plurality of die may be formed on a single semiconductor wafer which is subsequently diced in order to form the die.

Furthermore, the present disclosure is not limited to SOI platforms. Also other platforms may be integrated in a flexible electronics by way of the present disclosure. In addition, those areas in which it is believed that those of ordinary skill in the art are familiar have not been described herein in order not to unnecessarily obscure the invention described. Accordingly, it has to be understood that the invention is not to be limited by the specific illustrative embodiments, but only by the scope of the appended claims.

The invention claimed is:

1. A method for making a flexible electronic device comprising:
   forming at least one flexible substrate electrical connection on a flexible substrate;
   forming at least one semiconductor device comprising a substrate region, and an active region, the active region comprising at least one semiconductor device electrical connection, the at least one semiconductor device having a thickness so that the at least one semiconductor device is not flexible;
   bonding the at least one semiconductor device onto the flexible substrate so that the at least one flexible substrate electrical connection is coupled with the at least one semiconductor device electrical connection; and thinning, after the bonding, the substrate region of the at least one semiconductor device to make the at least one semiconductor device flexible.

2. The method according to claim 1 further comprising keeping the flexible substrate stiff during the bonding and the thinning.

3. The method according to claim 1 wherein the flexible substrate is provided on a carrier substrate so as to be kept stiff.

4. The method according to claim 1 wherein the thickness of the at least one semiconductor device prior to the thinning is at least 100 micrometers, and after the thinning is 50 micrometers or less.

5. The method according to claim 1 wherein forming of the at least one semiconductor device comprises:

forming a plurality of semiconductor devices on a semiconductor wafer; and dicing the semiconductor wafer to provide a plurality of die, each die providing a corresponding semiconductor device.

6. The method according to claim 1 wherein forming of the flexible substrate comprises forming a plurality of connecting bumps on the flexible substrate to define a plurality of flexible substrate electrical connections.

7. The method according to claim 1 wherein forming of the at least one semiconductor device comprises forming a plurality of connecting bumps on the at least one semiconductor device to define a plurality of semiconductor device electrical connections.

8. The method according to claim 1 wherein the substrate region of the at least one semiconductor device comprises a sacrificial layer; and wherein thinning comprises etching the sacrificial layer so as to fracture the substrate region.

9. The method according to claim 1 wherein thinning comprises at least one of wet chemical etching and spin etching of the substrate region.

10. The method according to claim 1 wherein thinning comprises making porous at least a portion of the substrate region.

11. The method according to claim 1 wherein thinning comprises protecting the active region during the thinning.

12. The method according to claim 1 wherein the at least one semiconductor device comprises a silicon on insulator (SOI) device.

13. The method according to claim 1 wherein the at least one semiconductor device comprises an integrated circuit.

14. The method according to claim 1 wherein the flexible substrate comprises at least one of polyimide, flexible steel, polyether ether ketone, polyethylene naphthalate, and polyethylene terephthalate.

15. The method according to claim 2 further comprising using a system of rollers to keep the flexible substrate stiff.

16. The method according to claim 3 further comprising removing the carrier substrate after the thinning.

17. The method according to claim 11 wherein protecting of the active region during the thinning comprises:

forming a protective layer after the bonding, the protective layer encapsulating the at least one semiconductor device; and exposing a bottom of the at least one semiconductor device via a plurality of openings through the protective layer.

18. The method according to claim 11 wherein protecting of the active region during the thinning comprises:

providing a container for a etch bath, the container comprising at least one opening at a bottom thereof; and placing the container adjacent the at least one semiconductor device so that an upper surface of the substrate region of the at least one semiconductor device closes the at least one opening so as to prevent a vapor from the etch bath from reaching the active region of the at least one semiconductor device.

19. The method according to claim 12 wherein thinning comprises etching an insulator layer of the SOI device.

20. A method for making a flexible electronic device comprising:

forming at least one flexible substrate electrical connection on a flexible substrate;

forming at least one semiconductor device comprising a substrate region including a sacrificial layer, and an active region, the active region comprising at least one semiconductor device electrical connection, the at least one semiconductor device having a thickness so that the at least one semiconductor device is not flexible;

bonding the at least one semiconductor device onto the flexible substrate so that the at least one flexible substrate electrical connection is coupled with the at least one semiconductor device electrical connection;

thinning, after the bonding, the substrate region of the at least one semiconductor device by etching the sacrificial layer so as to fracture the substrate region and to make the at least one semiconductor device flexible; and keeping the flexible substrate stiff during the bonding and the thinning.

21. The method according to claim 20 wherein the flexible substrate is provided on a carrier substrate so as to be kept stiff.

22. The method according to claim 20 wherein the thickness of the at least one semiconductor device prior to the thinning is at least 100 micrometers, and after the thinning is 50 micrometers or less.

23. The method according to claim 21 wherein forming of the at least one semiconductor device comprises:

forming a plurality of semiconductor devices on a semiconductor wafer; and dicing the semiconductor wafer to provide a plurality of die, each die providing a corresponding semiconductor device.

24. The method according to claim 20 wherein forming of the flexible substrate comprises forming a plurality of connecting bumps on the flexible substrate to define a plurality of flexible substrate electrical connections.

25. The method according to claim 21 further comprising removing the carrier substrate after the thinning.

26. The method according to claim 21 further comprising using a system of rollers to keep the flexible substrate stiff.

* * * * *

UNITED STATES PATENT AND TRADEMARK OFFICE
CERTIFICATE OF CORRECTION

| | | |
|---|---|---|
| PATENT NO. | : 8,586,451 B2 | Page 1 of 1 |
| APPLICATION NO. | : 13/533224 | |
| DATED | : November 19, 2013 | |
| INVENTOR(S) | : Vinciguerra et al. | |

It is certified that error appears in the above-identified patent and that said Letters Patent is hereby corrected as shown below:

In the Claims

Delete: "claim 21"

Column 16, Line 44          Insert: -- claim 20 --

Signed and Sealed this
Sixteenth Day of September, 2014

Michelle K. Lee
*Deputy Director of the United States Patent and Trademark Office*